(12) United States Patent
Tomimoto

(10) Patent No.: US 9,019,692 B2
(45) Date of Patent: Apr. 28, 2015

(54) ELECTRONIC APPARATUS

(71) Applicant: Canon Kabushiki Kaisha, Tokyo (JP)

(72) Inventor: Honkai Tomimoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 270 days.

(21) Appl. No.: 13/725,241

(22) Filed: Dec. 21, 2012

(65) Prior Publication Data

US 2013/0163161 A1 Jun. 27, 2013

(30) Foreign Application Priority Data

Dec. 26, 2011 (JP) ................................. 2011-283613
Oct. 22, 2012 (JP) ................................. 2012-232913

(51) Int. Cl.
*G06F 1/16* (2006.01)
*H05K 7/00* (2006.01)
*G03B 17/02* (2006.01)
*G03B 17/56* (2006.01)

(52) U.S. Cl.
CPC ........ *H05K 7/00* (2013.01); *G03B 17/02* (2013.01); *G03B 2217/002* (2013.01); *G03B 17/566* (2013.01)

(58) Field of Classification Search
USPC ......... 361/679.01, 679.03; 29/469; 24/115 A, 24/115 R, 128, 129 R; 396/535
See application file for complete search history.

(56) References Cited

U.S. PATENT DOCUMENTS

| | | | | |
|---|---|---|---|---|
| 4,313,664 A | * | 2/1982 | Finnemore ..................... | 396/420 |
| 4,348,095 A | * | 9/1982 | Suzuki et al. ................. | 396/539 |
| 4,719,671 A | * | 1/1988 | Ito et al. ....................... | 24/115 R |
| 5,305,031 A | * | 4/1994 | Hayakawa ...................... | 396/26 |
| 5,369,846 A | * | 12/1994 | Suarez et al. ..................... | 24/35 |
| 5,568,217 A | * | 10/1996 | Arai et al. ..................... | 396/536 |
| 6,163,450 A | | 12/2000 | Kim | |
| 6,182,481 B1 | * | 2/2001 | Nagy ................................ | 70/58 |
| 6,456,500 B1 | * | 9/2002 | Chen ............................ | 361/752 |
| 6,595,703 B1 | * | 7/2003 | Laituri et al. ................. | 396/423 |
| 7,574,779 B2 | * | 8/2009 | Takahashi ................... | 24/136 L |
| 7,715,192 B2 | * | 5/2010 | Takahama ................ | 361/679.59 |
| 8,014,133 B2 | * | 9/2011 | Dong et al. ............. | 361/679.01 |
| 8,223,480 B2 | * | 7/2012 | Dong ........................ | 361/679.03 |
| 8,243,444 B2 | * | 8/2012 | Kawada et al. .......... | 361/679.59 |
| 8,325,481 B2 | * | 12/2012 | Dong et al. .............. | 361/679.55 |
| 8,411,424 B2 | * | 4/2013 | Hsiung ..................... | 361/679.02 |
| 2009/0086440 A1 | * | 4/2009 | Takahama ..................... | 361/724 |

(Continued)

FOREIGN PATENT DOCUMENTS

| | | |
|---|---|---|
| CN | 101404860 A | 4/2009 |
| JP | H02-180095 A | 7/1990 |

(Continued)

*Primary Examiner* — Adrian S Wilson

(74) *Attorney, Agent, or Firm* — Canon USA Inc IP Division

(57) ABSTRACT

Provided is an electronic apparatus equipped with a strap attaching member. The strap attaching member includes a first portion in which a fixing portion for the electronic apparatus, an upper surface, and first areas located at both sides of the upper surface are provided; a second portion in which a bottom surface and second areas located at both sides of the bottom surface are provided; and a joint portion that joins the first portion and the second portion together. The strap attaching member is formed by folding the joint portion so that the back of the upper surface and the bottom surface face each other and the first areas and the second areas lie on top of one another.

12 Claims, 13 Drawing Sheets

(56) References Cited

U.S. PATENT DOCUMENTS

| | | | |
|---|---|---|---|
| 2010/0033911 A1* | 2/2010 | Chang et al. | 361/679.01 |
| 2010/0035666 A1* | 2/2010 | Chang et al. | 455/575.1 |
| 2010/0290181 A1* | 11/2010 | Huang | 361/679.32 |
| 2011/0194235 A1* | 8/2011 | Ikezawa | 361/679.01 |
| 2011/0228455 A1* | 9/2011 | Dong | 361/679.01 |
| 2013/0051786 A1* | 2/2013 | Matsuzawa | 396/535 |

FOREIGN PATENT DOCUMENTS

| | | |
|---|---|---|
| JP | H11-017356 A | 1/1999 |
| JP | 11-070013 A | 3/1999 |
| JP | 2009-088366 A | 4/2009 |
| JP | 2010-255199 A | 11/2010 |

\* cited by examiner

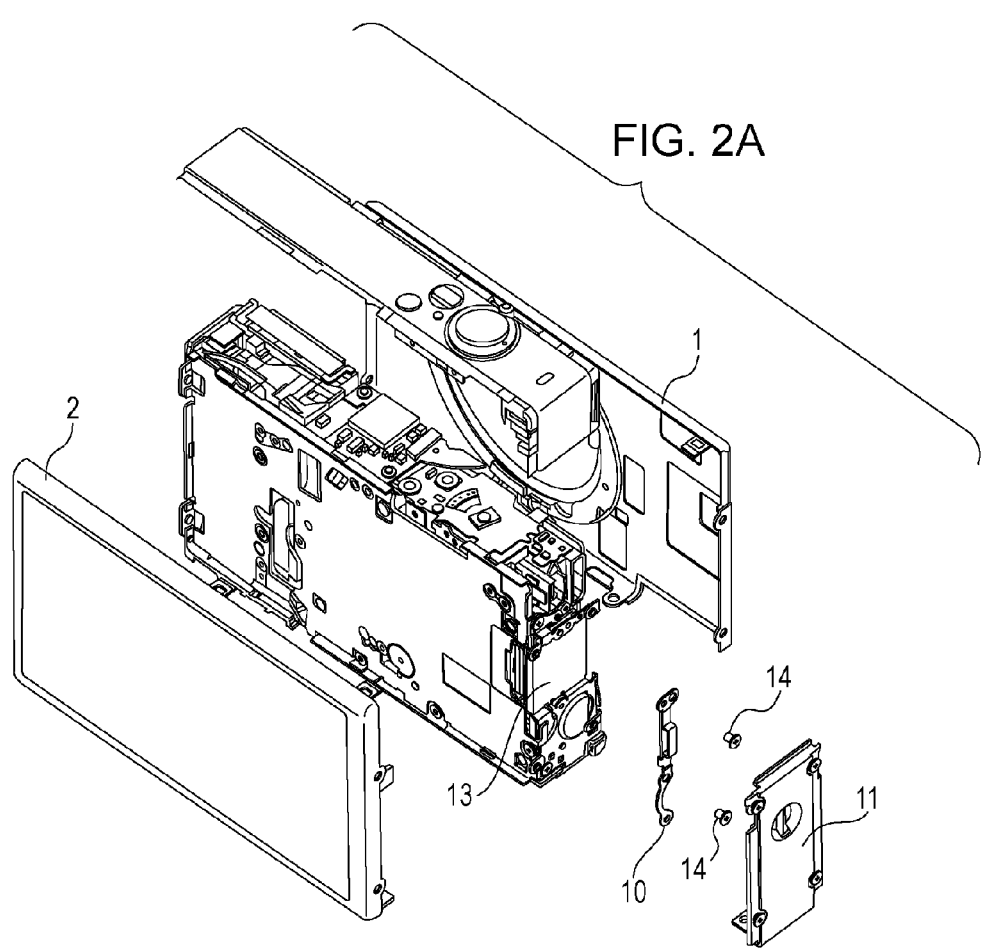

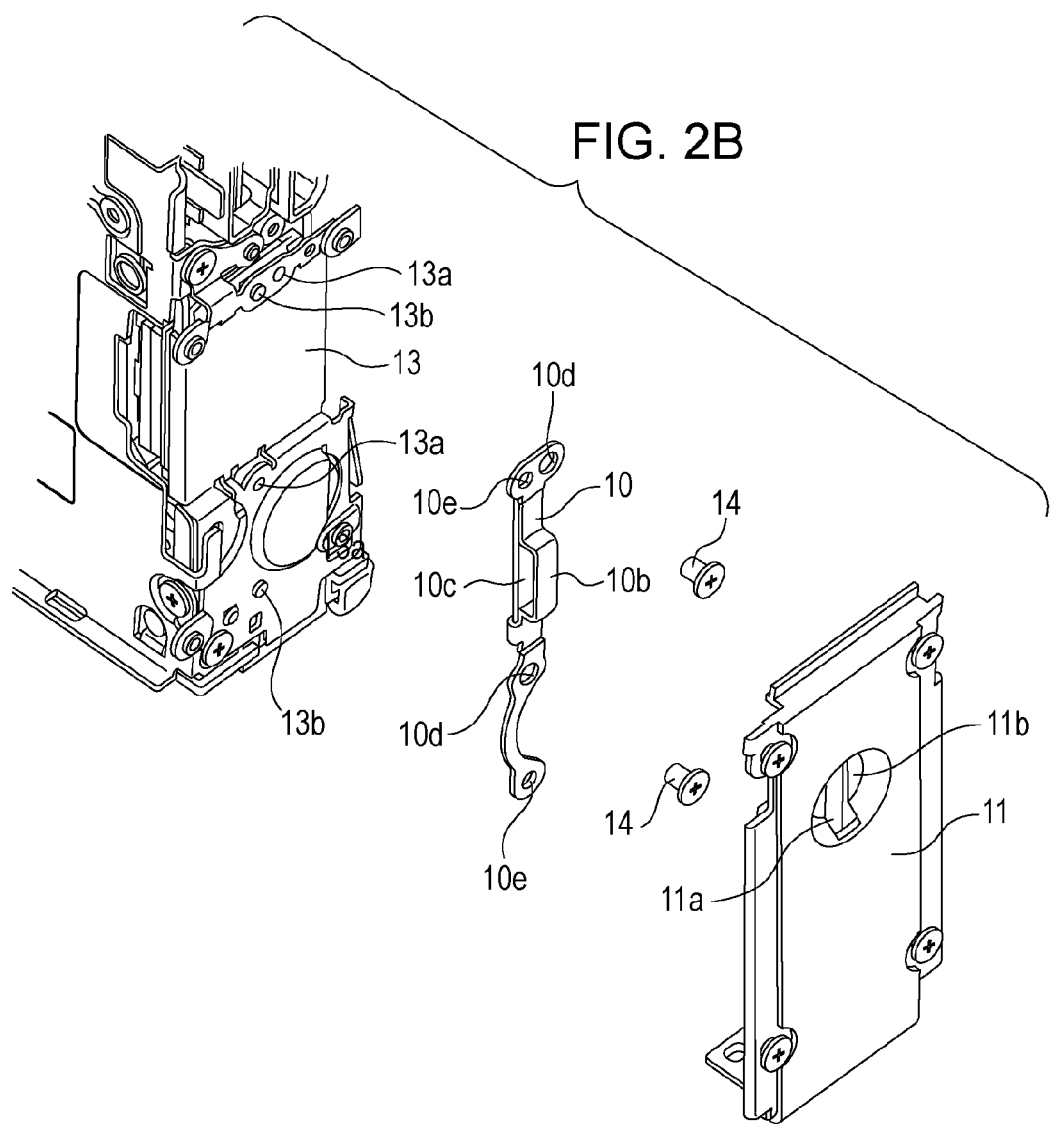

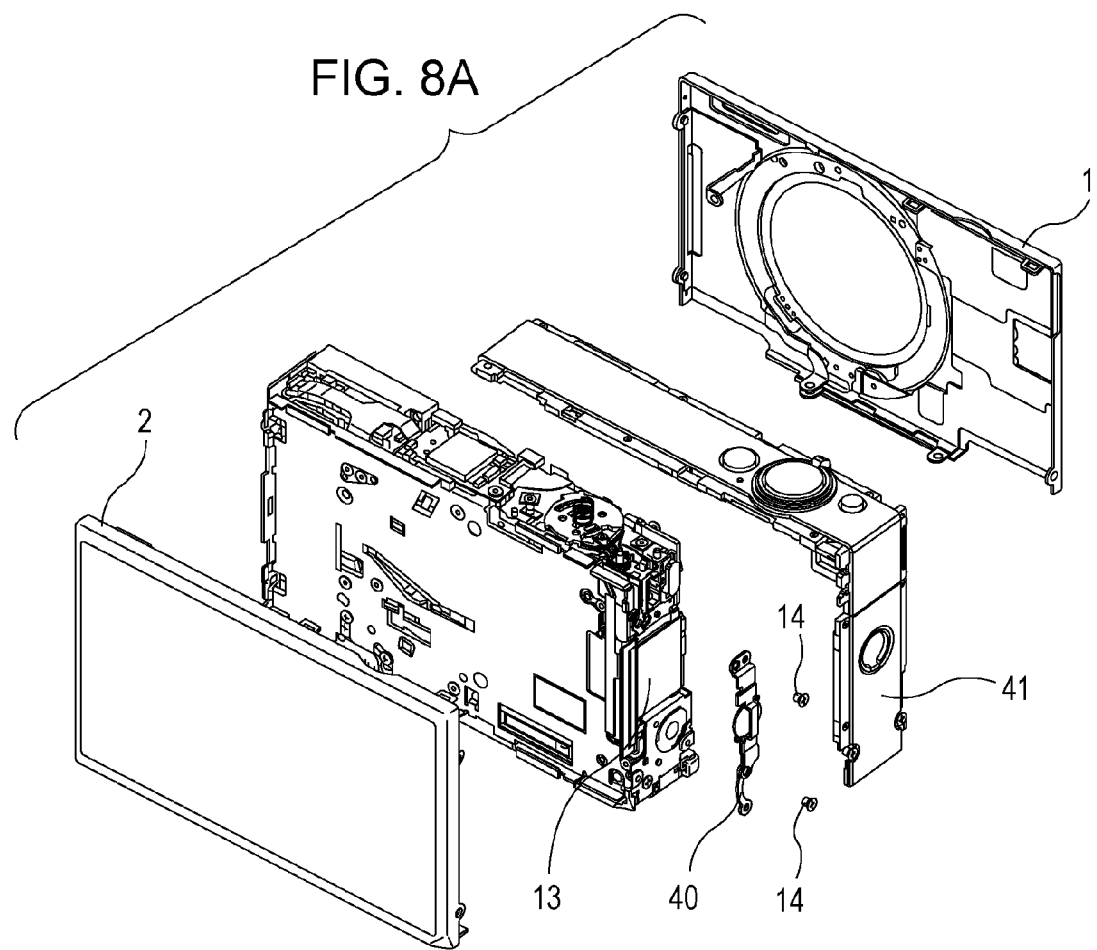

ELECTRONIC APPARATUS

BACKGROUND OF THE INVENTION

1. Field of the Invention

The present invention relates to an electronic apparatus and, in particular, to an electronic apparatus equipped with a strap attaching member.

2. Description of the Related Art

Electronic apparatuses, such as digital cameras and mobile phones, are equipped with a strap attaching portion, so that a strap can be attached to the strap attaching portion.

A strap attaching portion disclosed in Japanese Patent Laid-Open No. 2009-88366 is configured such that the upper surface thereof is made of plastic, and the bottom surface thereof is made of a sheet metal.

SUMMARY OF THE INVENTION

An aspect of the present invention relates to an electronic apparatus including a strap attaching member to which a strap can be attached. The strap attaching member includes a first portion in which a fixing portion for the electronic apparatus, an upper surface, and first areas located at both sides of the upper surface are provided; a second portion in which a bottom surface and second areas located at both sides of the bottom surface are provided; and a joint portion that joins the first portion and the second portion together. The strap attaching member is formed by folding the joint portion so that the back of the upper surface and the bottom surface face each other and the first areas and the second areas lie on top of one another.

According to some embodiments of the present invention, an electronic apparatus equipped with a thin, compact strap attaching member that is cheap to manufacture can be provided.

Further features of the present invention will become apparent from the following description of exemplary embodiments with reference to the attached drawings.

BRIEF DESCRIPTION OF THE DRAWINGS

FIG. 2A is an exploded perspective view of the digital camera.

FIG. 2B is an enlarged view of the periphery of a strap attaching member.

FIG. 8A is an exploded perspective view of the digital camera.

DESCRIPTION OF THE EMBODIMENTS

First Embodiment

Figure 1A:
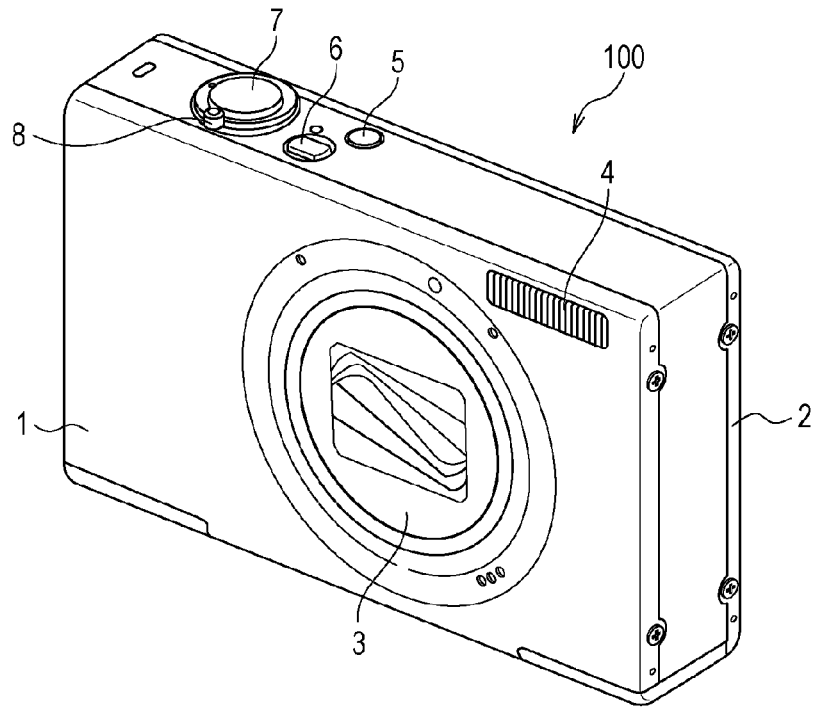
FIG. 1A is a perspective view illustrating the external appearance of a digital camera, which is an electronic apparatus according to an embodiment of the present invention.
Figure 1B:
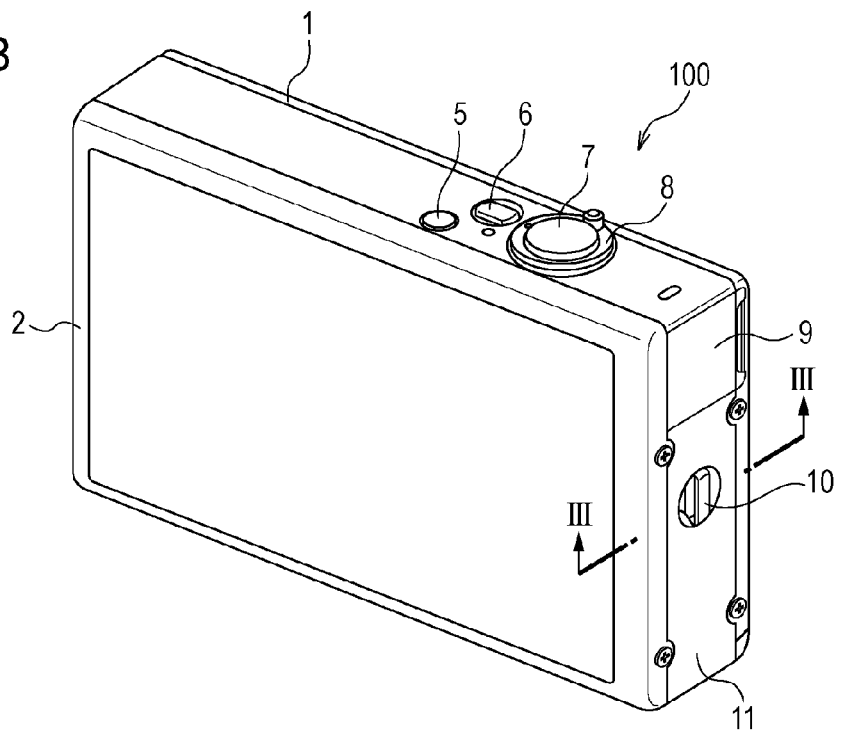
FIG. 1B is a perspective view illustrating the external appearance of the digital camera.

FIGS. 1A and 1B are perspective views illustrating the external appearance of a digital camera 100, which is an electronic apparatus according to an embodiment of the present invention. FIG. 1A is a perspective view of the digital camera 100 viewed from the front. FIG. 1B is a perspective view of the digital camera 100 viewed from the back.

In FIGS. 1A and 1B, a front cover 1 is an exterior member that covers the front surface of the digital camera 100; a rear cover 2 is an exterior member that covers the back surface of the digital camera 100; a lens barrel unit 3 extends forwards to form an image of a subject on an image pickup device when the digital camera 100 enters an image capturing mode; and a strobe unit 4 illuminates the subject by flashing.

A mode switching button 5 switches the digital camera 100 between an image capturing mode and a reproducing mode when pressed. A power button 6 turns on or off the power source of the digital camera 100 when pressed. A release button 7 executes an autofocusing operation when pressed and thereafter starts an image capturing operation. A zoom lever 8 executes a zooming operation when rotated.

A terminal cover 9 is a member that covers an external connection terminal. When a cable is to be connected to the external connection terminal, the terminal cover 9 is opened to expose the external connection terminal. A strap attaching member 10 has a ring shape so that a strap can be attached thereto.

FIGS. 2A and 2B are exploded perspective views of the digital camera 100. FIG. 2A is an overall view of the exploded digital camera 100. FIG. 2B is an enlarged view of the periphery of the strap attaching member 10 in FIG. 2A.

In FIGS. 2A and 2B, a side cover 11 is an exterior member that covers a side surface of the digital camera 100. The strap attaching member 10 is fastened to a fixing member 13 inside the side cover 11 with two screws 14.

As shown in FIG. 2B, the fixing member 13 is provided with screw holes 13a into which the screws 14 are screwed and positioning portions 13b that position the strap attaching member 10. The strap attaching member 10 is provided with fit portions 10e that fit on the positioning portions 13b and fixing portions 10d through which the screws 14 are passed. The side cover 11 is provided with a through hole 11a and a depression 11b.

After the strap attaching member 10 is positioned to the fixing member 13 by fitting the fit portions 10e on the positioning portions 13b, the screws 14 are screwed into the screw holes 13a. When the side cover 11 is fastened to the fixing member 13 with screws, an upper surface 10b of the strap attaching member 10 is exposed into the depression 11b through the through hole 11a. Furthermore, a bottom surface 10c of the strap attaching member 10 closes the through hole 11a. When the side cover 11 is fastened to the fixing member 13 with screws, the front cover 1 and the rear cover 2 are also fastened together.

Figure 3:
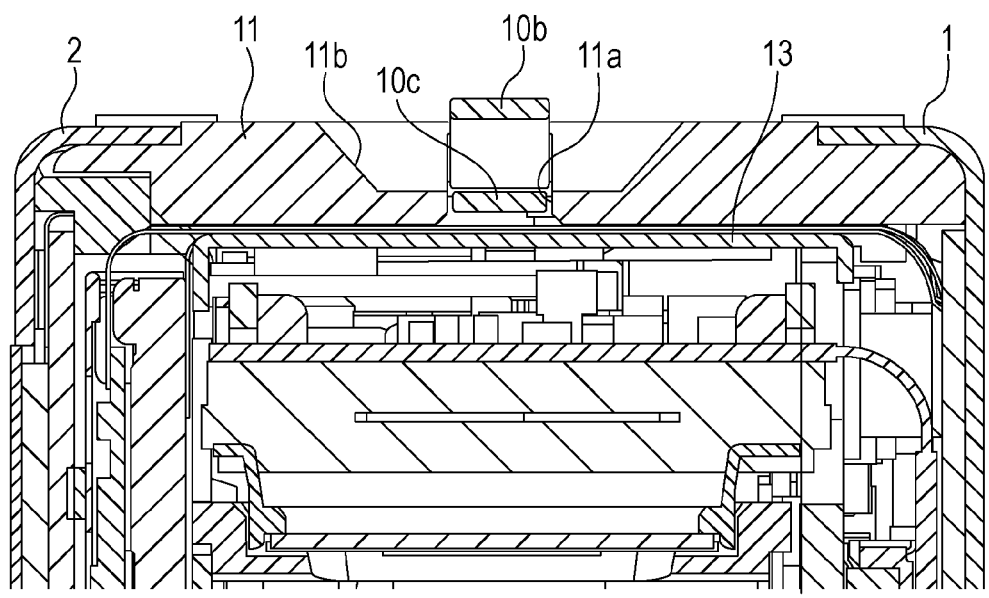
FIG. 3 is a cross-sectional view of the digital camera taken along line III-III in FIG. 1B.

FIG. 3 is a cross-sectional view of the digital camera 100 taken along line III-III in FIG. 1B. As shown in FIG. 3, the upper surface 10b and the bottom surface 10c of the strap attaching member 10 are exposed in the depression 11b. The bottom surface 10c of the strap attaching member 10 can close the through hole 11a. One end of a strap is guided along the depression 11b and is passed between the upper surface 10b and the bottom surface 10c of the strap attaching member 10. Since the through hole 11a is closed by the bottom surface 10c at that time, the end of the strap does not enter the digital camera 100 through the through hole 11a.

Figure 4A:
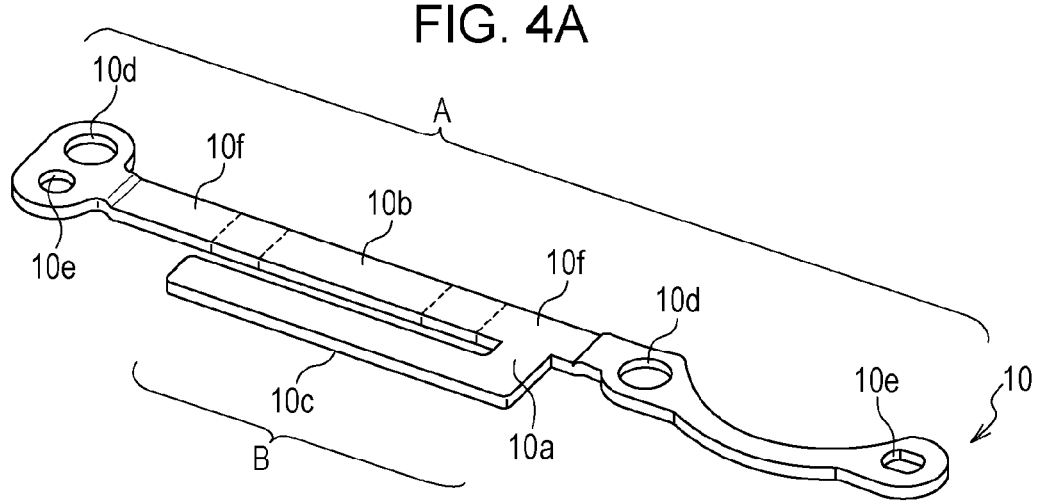
FIG. 4A is a diagram of the strap attaching member in a state before a first portion is subjected to folding.
Figure 4B:
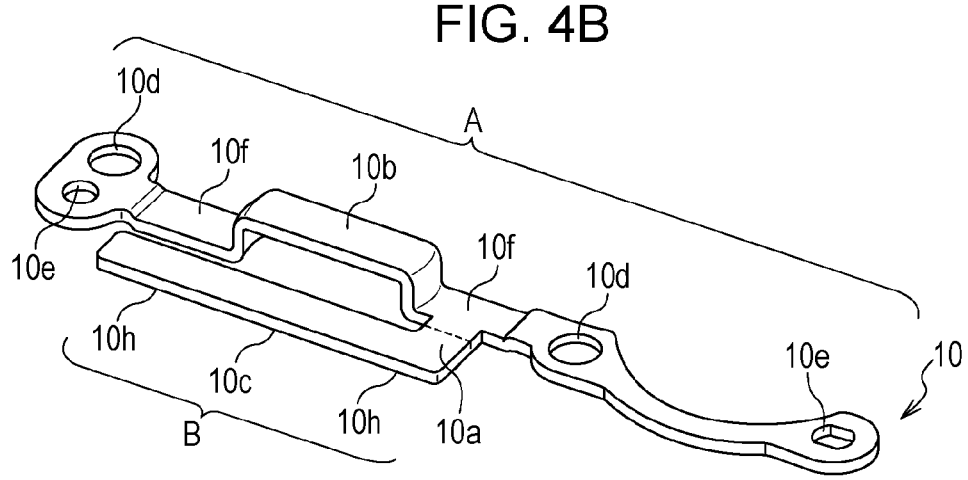
FIG. 4B is a diagram of the strap attaching member in a state after the first portion is subjected to folding.
Figure 4C:
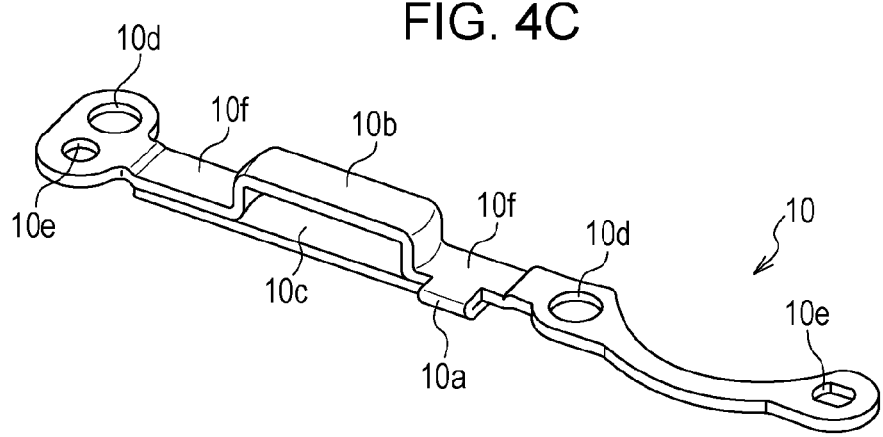
FIG. 4C is a diagram of the strap attaching member in a completed state in which a joint portion in the state in FIG. 4B is subjected to folding.

FIGS. 4A to 4C are diagrams illustrating the strap attaching member 10. FIG. 4A is a diagram of the strap attaching member 10 in a state before a first portion A is subjected to folding. FIG. 4B is a diagram of the strap attaching member 10 in a state after the first portion A is subjected to folding. FIG. 4C is a diagram of the strap attaching member 10 in a completed state after a joint portion 10a is subjected to folding from the state in FIG. 4B.

As shown in FIGS. 4A and 4B, the first portion A of the strap attaching member 10 is provided with the upper surface 10b, the fixing portions 10d, the fit portions 10e, and first areas 10f. The first areas 10f are provided at both sides of the upper surface 10b. A second portion B of the strap attaching member 10 is provided with the bottom surface 10c and second areas 10h on the back surface thereof. The second areas 10h are provided at both sides of the bottom surface 10c. The second portion B of the strap attaching member 10 is provided in parallel with the first portion A of the strap attaching member 10.

As shown in FIGS. 4A and 4B, the joint portion 10a is provided between the first portion A and the second portion B. The joint portion 10a joins one of the first areas 10f provide at both sides of the upper surface 10b and one of the second areas 10h provided at both sides of the bottom surface 10c.

By performing folding on the dotted line portions shown in FIG. 4A, the strap attaching member 10 reaches the state shown in FIG. 4B. Furthermore, by performing folding on the dotted line portion of the joint portion 10a shown in FIG. 4B, the strap attaching member 10 reaches the state shown in FIG. 4C. The state shown in FIG. 4C is the completed state of the strap attaching member 10. When the strap attaching member 10 is in the state shown in FIG. 4C, the back surface of the upper surface 10b and the bottom surface 10c face each other, and the first areas 10f provided at both sides of the upper surface 10b and the second areas 10h provided at both sides of the bottom surface 10c lie on top of one another. The second portion B has a length so as not to overlap with the fixing portions 10d and the fit portions 10e when the strap attaching member 10 is in the state shown in FIG. 4C.

In the first embodiment, since the portion to which a strap is to be attached (upper surface 10b) and the portion that closes the through hole 11a of the side cover 11 can be formed of the single strap attaching member 10, a thin, compact strap attaching member can be achieved at a low manufacturing cost.

In the first embodiment, since the fixing portions 10d and the fit portions 10e are formed at the first portion A at which the upper surface 10b is provided, the strap attaching member 10 can be fixed to the fixing member 13 with high accuracy. In the case where the fixing portions 10d and the fit portions 10e are provided at the second portion B, the attachment accuracy of the strap attaching member 10 to the fixing member 13 changes depending on the accuracy of folding from the state shown in FIG. 4B to the state shown in FIG. 4C.

In the strap attaching member 10, by performing welding, such as spot welding, on the positions where the first areas 10f and the second areas 10h lie on top of one another, the second portion B acts to prevent deformation of the upper surface 10b in the state shown in FIG. 4C even if a large force is exerted on the upper surface 10b. This can prevent deformation of the strap attaching member 10 even if the strap is pulled with a strong force.

Second Embodiment

A second embodiment of the present invention will be described with reference to FIGS. 5A to 5C. The second embodiment differs from the first embodiment described above only in that a strap attaching member 20 is used instead of the strap attaching member 10 of the first embodiment. Accordingly, the description of the configurations described using FIGS. 1A to 3 will be omitted.

Figure 5A:
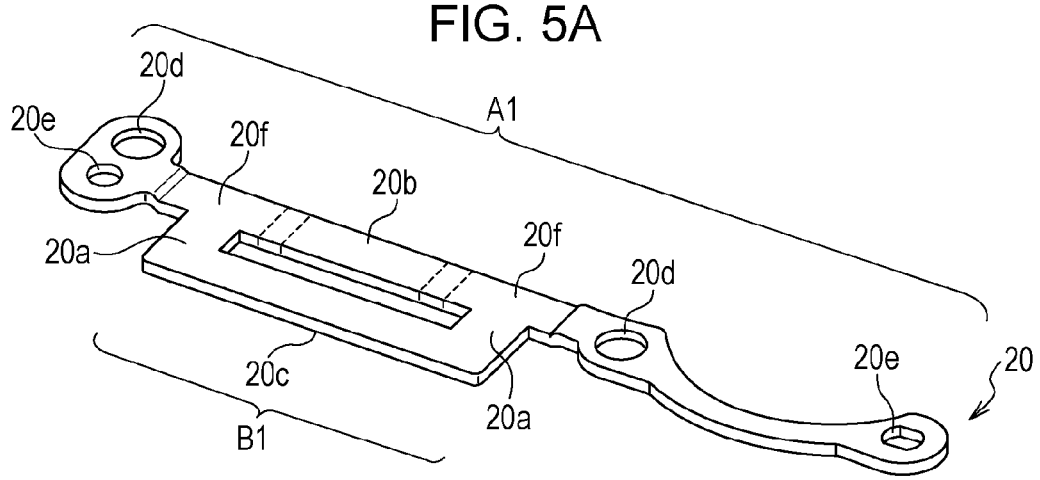
FIG. 5A is a diagram of a strap attaching member according to a second embodiment of the present invention, in a state before a first portion is subjected to drawing.
Figure 5B:
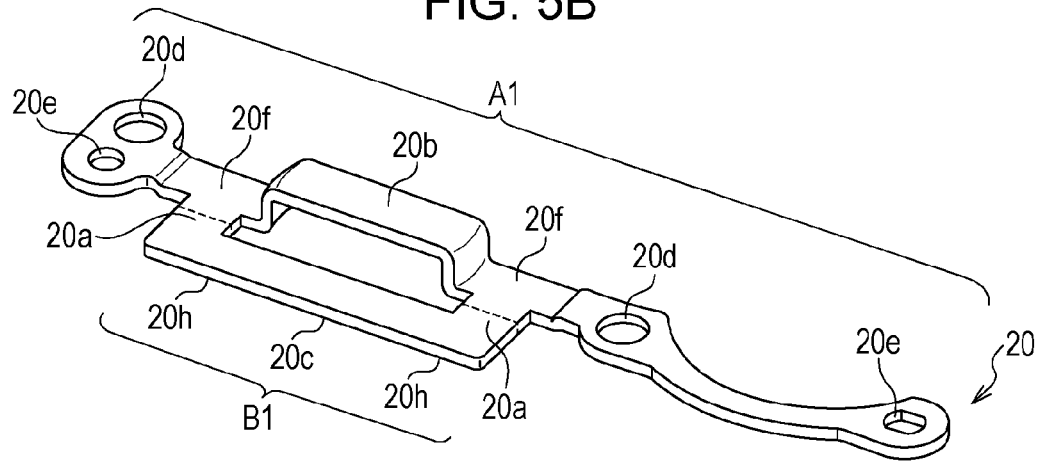
FIG. 5B is a diagram of the strap attaching member in a state after the first portion is subjected to drawing.
Figure 5C:
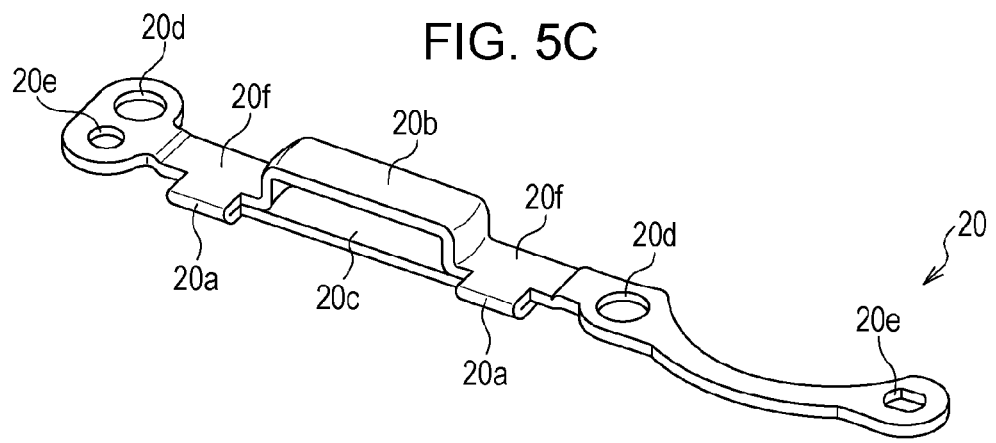
FIG. 5C is a diagram of the strap attaching member in a completed state in which joint portions of the strap attaching member in the state in FIG. 5B are subjected to folding.

FIGS. 5A to 5C are diagrams illustrating the strap attaching member 20. FIG. 5A is a diagram of the strap attaching member 20 in a state before a first portion A1 is subjected to drawing. FIG. 5B is a diagram of the strap attaching member 20 in a state after the first portion A1 is subjected to drawing. FIG. 5C is a diagram of the strap attaching member 20 in a completed state after joint portions 20a of the strap attaching member 20 are subjected to folding from the state in FIG. 5B.

As shown in FIGS. 5A and 5B, the first portion A1 of the strap attaching member 20 is provided with an upper surface 20b, fixing portions 20d, fit portions 20e, and first areas 20f. The first areas 20f are provided at both sides of the upper surface 20b. A second portion B1 of the strap attaching member 20 is provided with a bottom surface 20c and second areas 20h at the back surface thereof. The second areas 20h are provided at both sides of the bottom surface 20c. The second portion B1 of the strap attaching member 20 is provided in parallel with the first portion A1 of the strap attaching member 20.

As shown in FIGS. 5A and 5B, the joint portions 20a are provided between the first portion A1 and the second portion B1. The joint portions 20a join the two first areas 20f provided at both sides of the upper surface 20b and the two second areas 20h provided at both sides of the bottom surface 20c, respectively.

By performing drawing on the dotted line portions shown in FIG. 5A so as to make folds, the strap attaching member 20 reaches the state shown in FIG. 5B. Furthermore, by performing folding on the dotted line portions of the joint portions 20a shown in FIG. 5B, the strap attaching member 20 reaches the sate shown in FIG. 5C. The state shown in FIG. 5C is the completed state of the strap attaching member 20. When the strap attaching member 20 is in the state shown in FIG. 5C, the back surface of the upper surface 20b and the bottom surface 20c face each other, and the first areas 20f provided at both sides of the upper surface 20b and the second areas 20h provided at both sides of the bottom surface 20c lie on top of one another. The second portion B1 has a length so as not to overlap with the fixing portions 20d and the fit portions 20e when the strap attaching member 20 is in the state shown in FIG. 5C.

In the second embodiment, since the portion to which a strap is to be attached (upper surface 20b) and the portion that closes the through hole 11a of the side cover 11 can be formed of the single strap attaching member 20, a thin, compact strap attaching member can be achieved at a low manufacturing cost.

In the second embodiment, since the fixing portions 20d and the fit portions 20e are formed at the first portion A1 at which the upper surface 20b is provided, the strap attaching member 20 can be fixed to the fixing member 13 with high accuracy. In the case where the fixing portions 20d and the fit portions 20e are provided at the second portion B1, the attachment accuracy of the strap attaching member 20 to the fixing member 13 changes depending on the accuracy of folding from the state shown in FIG. 5B to the state shown in FIG. 5C.

Since the strap attaching member 20 is provided with the two joint portions 20a, the second portion B1 acts to prevent deformation of the upper surface 20b even if a large force is exerted on the upper surface 20b. This can prevent deformation of the strap attaching member 20 even if the strap is pulled with strong force.

Third Embodiment

A third embodiment of the present invention will be described with reference to FIGS. 6A to 6C. The third embodiment differs from the first embodiment described above only in that a strap attaching member 30 is used instead of the strap attaching member 10 of the first embodiment. Accordingly, the description of the configurations described using FIGS. 1A to 3 will be omitted.

Figure 6A:
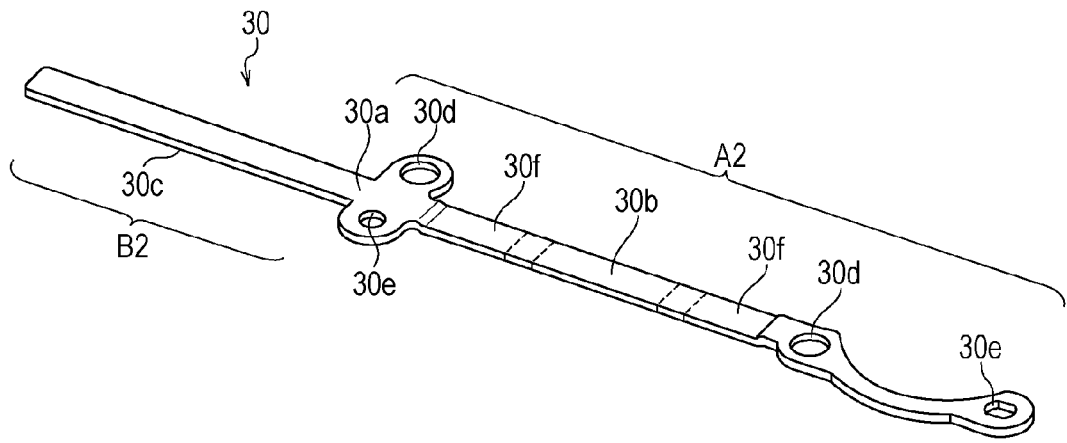
FIG. 6A is a diagram of a strap attaching member according to a third embodiment of the present invention in a state before a first portion is subjected to folding.
Figure 6B:
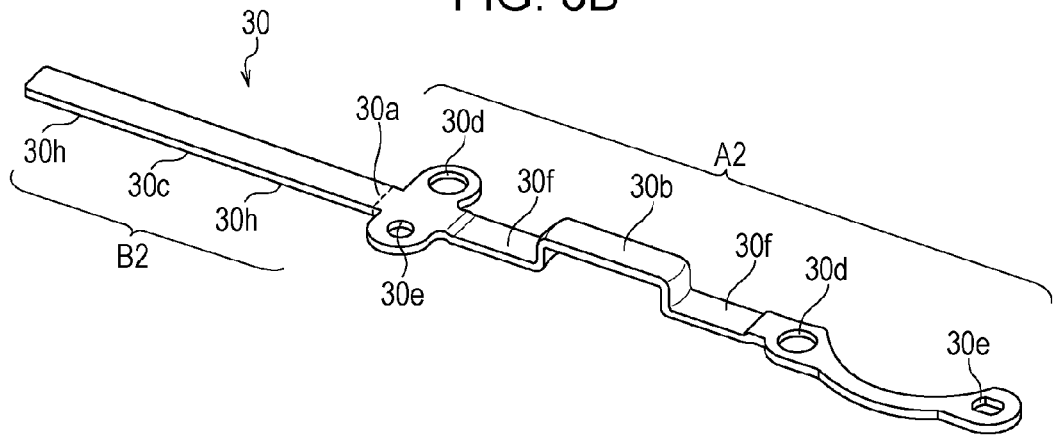
FIG. 6B is a diagram of the strap attaching member in a state after the first portion is subjected to folding.
Figure 6C:
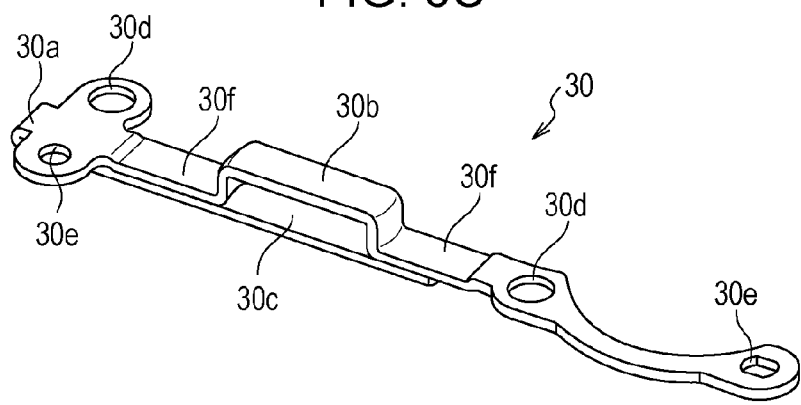
FIG. 6C is a diagram of the strap attaching member in a completed state in which a joint portion in the state in FIG. 6B is subjected to folding.

FIGS. 6A to 6C are diagrams illustrating the strap attaching member 30. FIG. 6A is a diagram of the strap attaching member 30 in a state before a first portion A2 is subjected to folding. FIG. 6B is a diagram of the strap attaching member 30 in a state after the first portion A2 is subjected to folding. FIG. 6C is a diagram of the strap attaching member 30 in a completed state after a joint portion 30a is subjected to folding from the state in FIG. 6B.

As shown in FIGS. 6A and 6B, the first portion A2 of the strap attaching member 30 is provided with an upper surface 30b, fixing portions 30d, fit portions 30e, and first areas 30f. The first areas 30f are provided at both sides of the upper surface 30b. A second portion B2 of the strap attaching member 30 is provided with a bottom surface 30c and second areas 30h on the back surface thereof. The second areas 30h are provided at both sides of the bottom surface 30c. The second portion B2 of the strap attaching member 30 is provided in series with the first portion A2 of the strap attaching member 30.

As shown in FIGS. 6A and 6B, the joint portion 30a is provided between the fixing portion 30d (fit portion 30e) and the second area 30h.

By performing folding on the dotted line portions shown in FIG. 6A, the strap attaching member 30 reaches the state shown in FIG. 6B. Furthermore, by performing folding on the dotted line portion of the joint portion 30a shown in FIG. 6B, the strap attaching member 30 reaches the state shown in FIG. 6C. The state shown in FIG. 6C is the completed state of the strap attaching member 30. When the strap attaching member 30 is in the state shown in FIG. 6C, the back surface of the upper surface 30b and the bottom surface 30c face each other, and the first areas 30f included in the first portion A2 and the second areas 30h included in the second portion B2 lie on top of one another. The second portion B2 has a length so as not to overlap with the fixing portions 30d and the fit portions 30e when the strap attaching member 30 is in the state shown in FIG. 6C.

In the third embodiment, since the portion to which a strap is to be attached (upper surface 30b) and the portion that closes the through hole 11a of the side cover 11 can be formed of the single strap attaching member 30, a thin, compact strap attaching member can be achieved at a low manufacturing cost.

In the third embodiment, since the fixing portions 30d and the fit portions 30e are formed at the first portion A2 at which the upper surface 30b is provided, the strap attaching member 30 can be fixed to the fixing member 13 with high accuracy. In the case where the fixing portions 30d and the fit portions 30e are provided at the second portion B2, the attachment accuracy of the strap attaching member 30 to the fixing member 13 changes depending on the accuracy of folding from the state shown in FIG. 6B to the state shown in FIG. 6C.

In the strap attaching member 30, by performing welding, such as spot welding, on the positions where the first areas 30f and the second areas 30h lie on top of one another, the second portion B2 acts to prevent deformation of the upper surface 30b in the state shown in FIG. 6C even if a large force is exerted on the upper surface 30b. This can prevent deformation of the strap attaching member 30 even if the strap is pulled with a strong force.

Fourth Embodiment

Figure 7A:
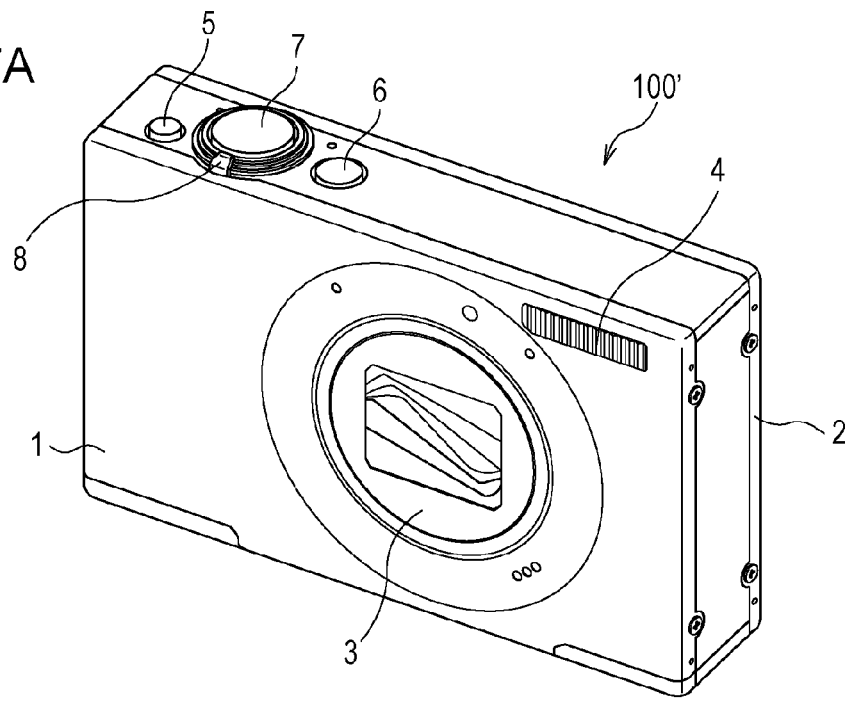
FIG. 7A is a perspective view illustrating the external appearance of a digital camera, which is an electronic apparatus according to an embodiment of the present invention.
Figure 7B:
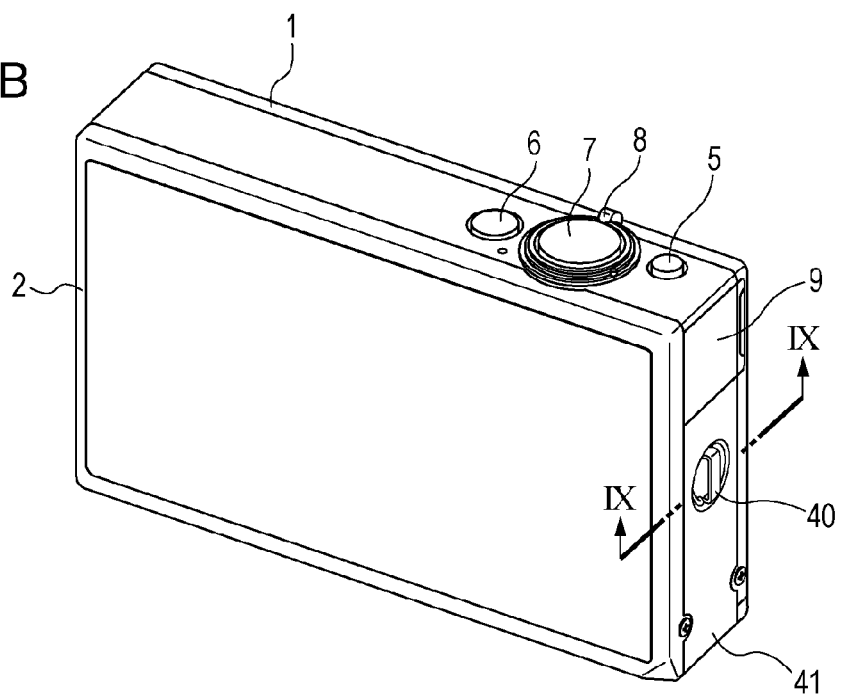
FIG. 7B is a perspective view illustrating the external appearance of the digital camera.

FIGS. 7A and 7B are perspective views illustrating the external appearance of a digital camera 100', which is an electronic apparatus according to an embodiment of the present invention. FIG. 7A is a perspective view of the digital camera 100' viewed from the front. FIG. 7B is a perspective view of the digital camera 100' viewed from the back.

In FIGS. 7A and 7B, parts similar to those in the first embodiment described above are given the same reference signs in FIGS. 1A and 1B, and descriptions thereof will be omitted. A strap attaching member 40 shown in FIG. 7B has a ring shape so that a strap can be attached thereto.

Figure 8B:
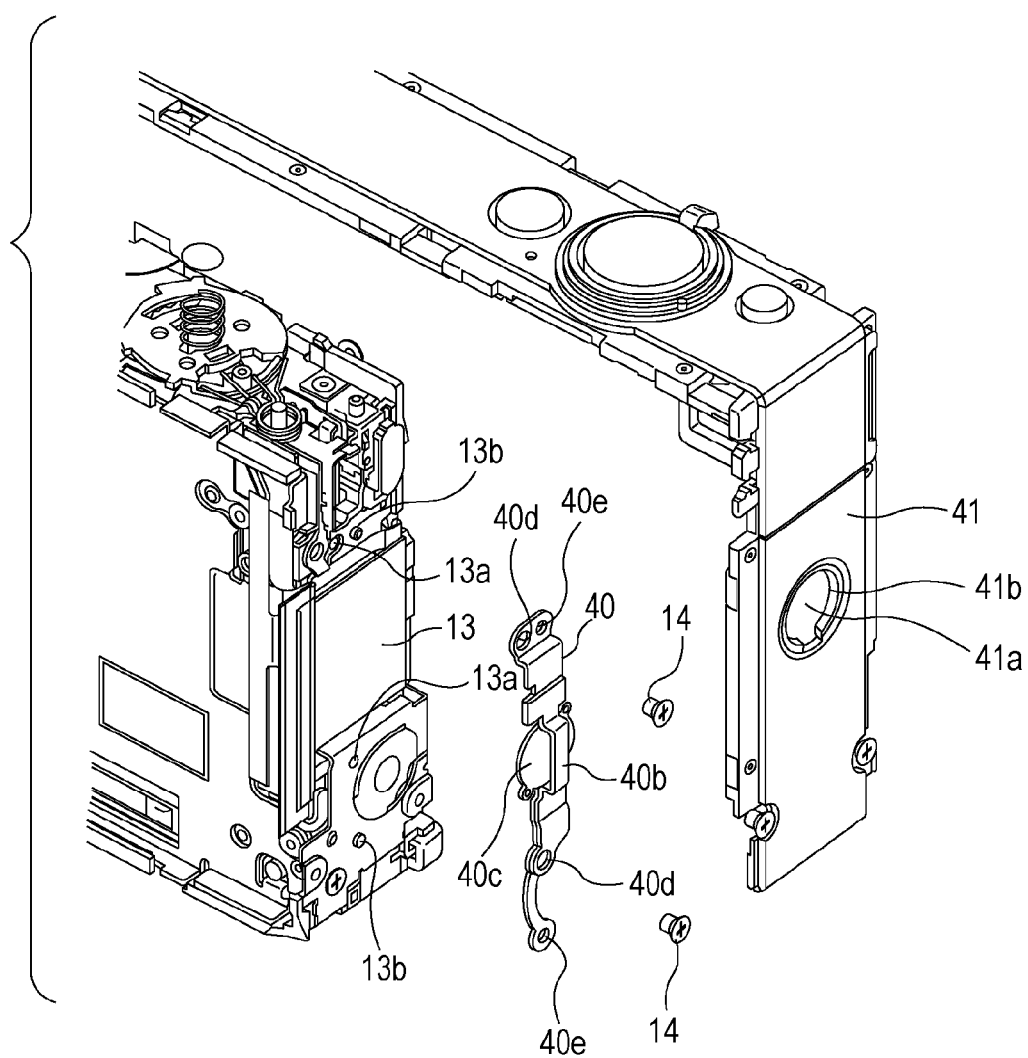
FIG. 8B is an enlarged view of the periphery of a strap attaching member.

FIGS. 8A and 8B are exploded perspective views of the digital camera 100'. FIG. 8A is an overall view of the exploded digital camera 100'. FIG. 8B is an enlarged view of the periphery of the strap attaching member 40 in FIG. 8A.

In FIGS. 7A and 7B, a top side cover 41 is an exterior member that covers the upper surface and a side surface of the digital camera 100'. The strap attaching member 40 is fastened to the fixing member 13 inside the top side cover 41 with two screws 14.

As shown in FIG. 8B, the fixing member 13 is provided with the screw holes 13a into which the screws 14 are screwed and the positioning portions 13b that position the strap attaching member 40. The strap attaching member 40 is provided with fit portions 40e that fit on the positioning portions 13b and fixing portions 40d through which the screws 14 are passed. The top side cover 41 is provided with a through hole 41a and a depression 41b.

After the strap attaching member 40 is positioned to the fixing member 13 by fitting the fit portions 40e on the positioning portions 13b, the screws 14 are screwed into the screw holes 13a. When the top side cover 41 is fastened to the fixing member 13 with screws, an upper surface 40b of the strap attaching member 40 is exposed into a depression 41b through a through hole 41a. Furthermore, a bottom surface 40c of the strap attaching member 40 closes the through hole 41a. When the top side cover 41 is fastened to the fixing member 13 with screws, the front cover 1 and the rear cover 2 are also fastened together.

Figure 9:
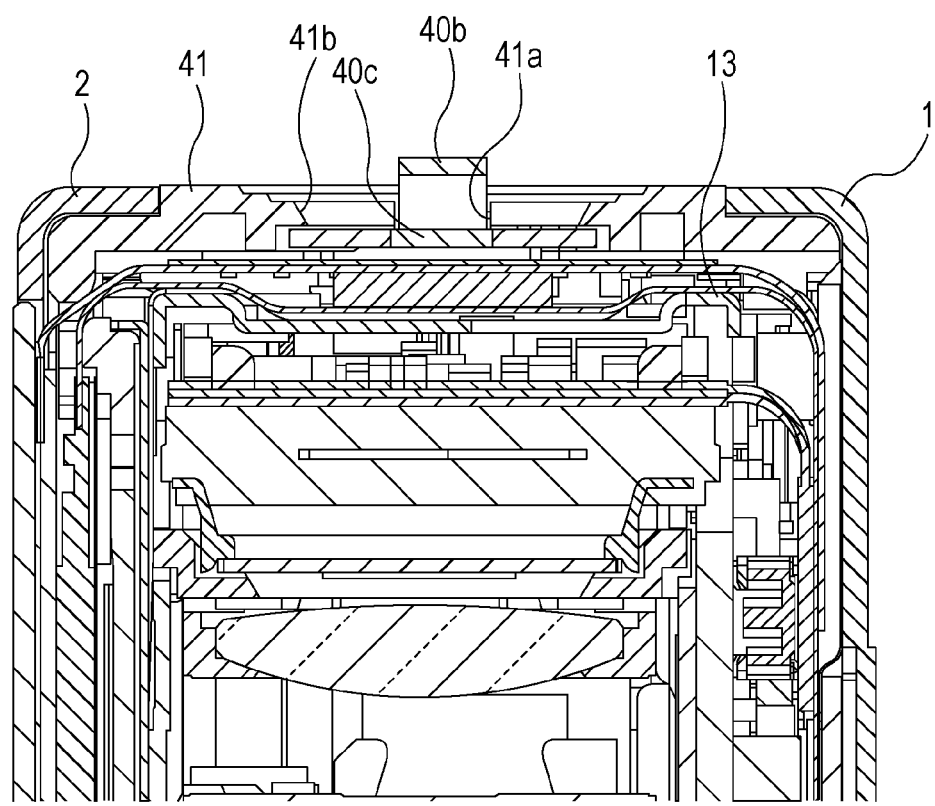
FIG. 9 is a cross-sectional view of the digital camera taken along line IX-IX in FIG. 7B.

FIG. 9 is a cross-sectional view of the digital camera 100' taken along line IX-IX in FIG. 7B. As shown in FIG. 9, the upper surface 40b and the bottom surface 40c of the strap attaching member 40 are exposed in the depression 41b. Since the external form of the bottom surface 40c of the strap attaching member 40 is one size larger than the external form of the through hole 41a, the bottom surface 40c can completely close the through hole 41a.

When a strap is to be attached to the digital camera 100', one end of the strap is guided along the depression 41b and is passed between the upper surface 40b and the bottom surface 40c of the strap attaching member 40. Since the through hole 41a is closed by the bottom surface 40c at that time, the end of the strap does not enter the digital camera 100' through the through hole 41a.

Figure 10A:
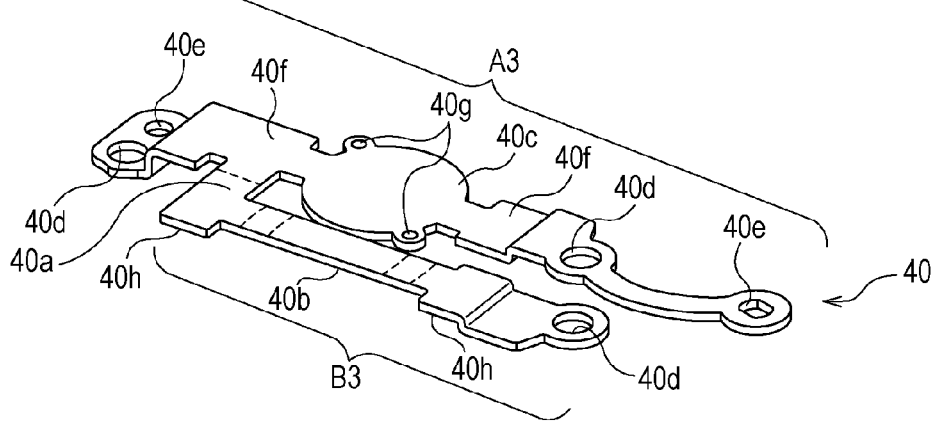
FIG. 10A is a diagram of a strap attaching member according to a fourth embodiment of the present invention in a state before a first portion is subjected to folding.
Figure 10B:
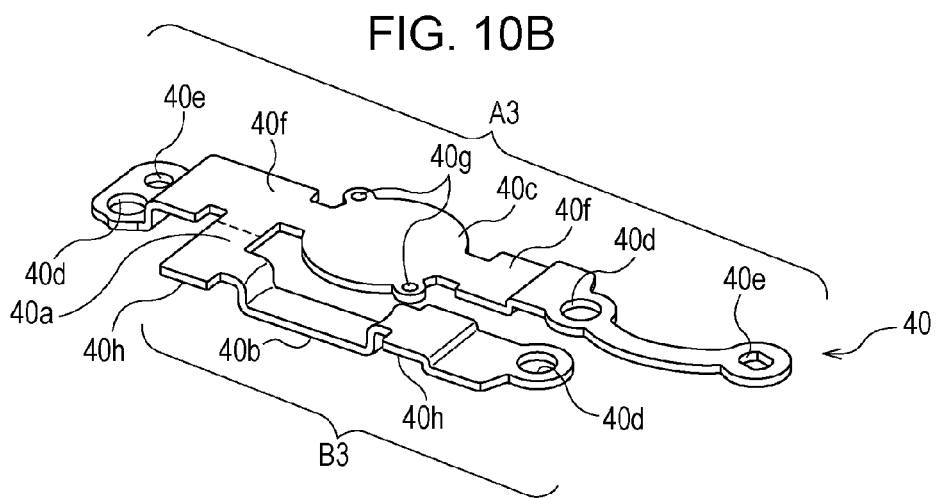
FIG. 10B is a diagram of the strap attaching member in a state after the first portion is subjected to folding.
Figure 10C:
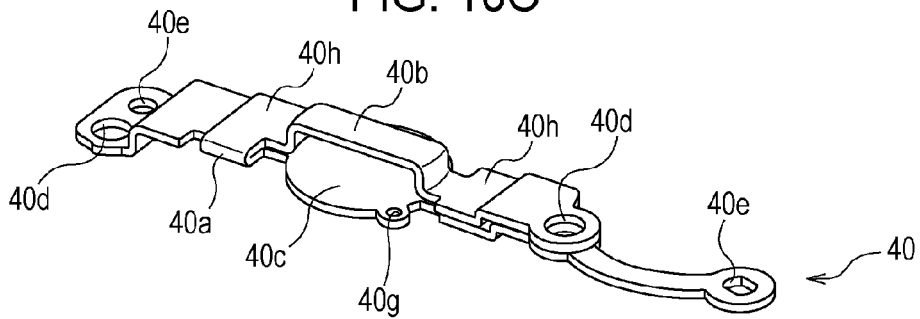
FIG. 10C is a diagram of the strap attaching member in a completed state in which a joint portion in the state in FIG. 10B is subjected to folding.

FIGS. 10A to 10C are diagrams illustrating the strap attaching member 40. FIG. 10A is a diagram of the strap attaching member 40 in a state before a second portion B3 is subjected to folding. FIG. 10B is a diagram of the strap attaching member 40 in a state after the second portion B3 is subjected to folding. FIG. 10C is a diagram of the strap attaching member 40 in a completed state after a joint portion 40a is subjected to folding from the state in FIG. 10B.

As shown in FIGS. 10A and 10B, a first portion A3 of the strap attaching member 40 is provided with the bottom surface 40c, two of the fixing portions 40d, the fit portions 40e, and first areas 40f. The first areas 40f are provided at both sides of the bottom surface 40c. The second portion B3 of the strap attaching member 40 is provided with the upper surface 40b, second areas 40h at the back surface thereof, and one of the fixing portions 40d. The second areas 40h are provided at both sides of the upper surface 40b. The second portion B3 of the strap attaching member 40 is provided in parallel with the first portion A3 of the strap attaching member 40.

An orientation in which the bottom surface 40c and the first areas 40f are arranged side by side in the first portion A3 of the strap attaching member 40 and an orientation in which the upper surface 40b and the second areas 40h are arranged side by side in the second portion B3 of the strap attaching member 40 are the same.

As shown in FIGS. 10A and 10B, the joint portion 40a is provided between the first portion A3 and the second portion B3. The joint portions 40a joins one of the first areas 40f provided at both sides of the bottom surface 40c and one of the second areas 40h provided at both sides of the upper surface 40b.

By performing folding on the dotted line portions shown in FIG. 10A, the strap attaching member 40 reaches the state shown in FIG. 10B. Furthermore, by performing folding on the dotted line portion of the joint portion 40a shown in FIG. 10B, the strap attaching member 40 reaches the state shown in FIG. 10C. The state shown in FIG. 10C is the completed state of the strap attaching member 40. When the strap attaching member 40 is in the state shown in FIG. 10C, the back surface of the upper surface 40b and the bottom surface 40c face each other, and the first areas 40f provided at both sides of the bottom surface 40c and the second areas 40h provided at both sides of the upper surface 40b lie on top of one another. By performing welding, such as spot welding, on the positions where the first areas 40f and the second areas 40h lie on top of one another, the first portion A3 acts to prevent deformation of the upper surface 40b even if a large force is exerted on the upper surface 40b.

Holes 40g provided outside the bottom surface 40c are holes for coating electrodes when the strap attaching member 40 is subjected to electrodeposition coating. When the strap attaching member 40 is subjected to electrodeposition coating, only the vicinity of the holes 40g is not subjected to electrodeposition coating, so that the vicinity of the holes 40g is not coated. The holes 40g are located outside the circumference of the bottom surface 40c and outside the through hole 41a of the top side cover 41. Since the holes 40g are located outside the through hole 41a, the uncoated areas in the vicinity of the holes 40g are inside the digital camera 100', so that they do not form the external appearance of the digital camera 100'.

In the fourth embodiment, since the portion to which a strap is to be attached (upper surface 40b) and the portion that closes the through hole 41a of the top side cover 41 can be formed of the single strap attaching member 40, a thin, compact strap attaching member can be achieved at a low manufacturing cost.

In the fourth embodiment, since the strap attaching member 40 is configured such that one of the fixing portions 40d is provided in the second portion B3 in which the upper surface 40b is provided, the second portion B3 acts to prevent deformation of the upper surface 40b by fixing the fixing portions 40d to the fixing member 13 in the state shown in FIG. 10C even if a large force is exerted on the upper surface 40b. This can prevent deformation of the strap attaching member 40 even if the strap is pulled with a strong force.

In the fourth embodiment, the bottom surface 40c completely closes the through hole 41a, and there is no gap between the through hole 41a and the digital camera 100', which prevents unwanted light flux from entering the digital camera 100'.

In the fourth embodiment, the first portion A3 is provided with two of the fixing portions 40d to be fixed to the fixing member 13, and the second portion B3 is provided with the upper surface 40b exposed to the outside of the digital camera 100'. Thus, even if heat in the digital camera 100' is transmitted to the first portion A3 via the fixing member 13, most of the heat is dissipated at the bottom surface 40c, so that the amount of heat transmitted to the upper surface 40b is small.

Fifth Embodiment

A fifth embodiment of the present invention will be described with reference to FIGS. 11A to 11C. The fifth embodiment differs from the fourth embodiment described above only in that a strap attaching member 50 is used instead of the strap attaching member 40 of the fourth embodiment. Accordingly, the description of the configurations described in FIGS. 7A to 9 will be omitted.

Figure 11A:
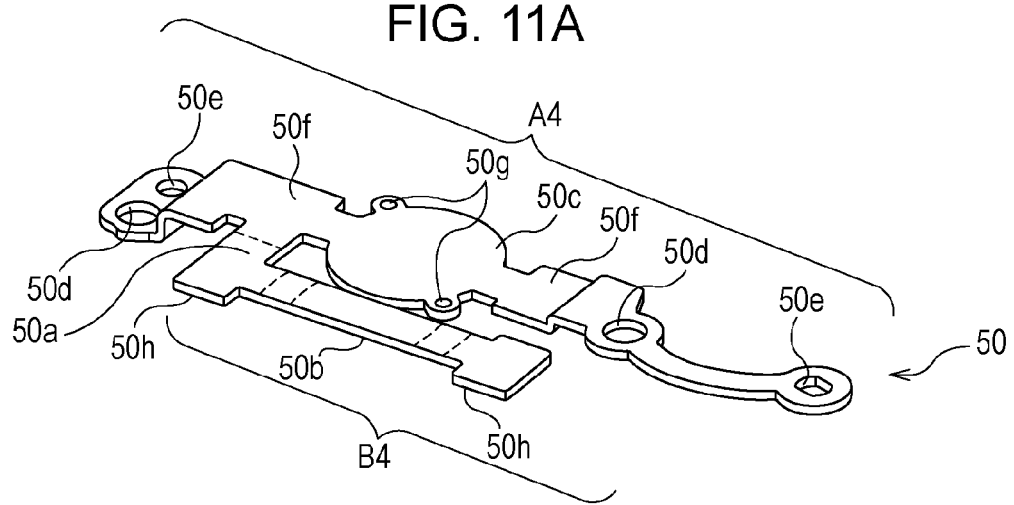
FIG. 11A is a diagram of a strap attaching member according to a fifth embodiment of the present invention in a state before a first portion is subjected to folding.
Figure 11B:
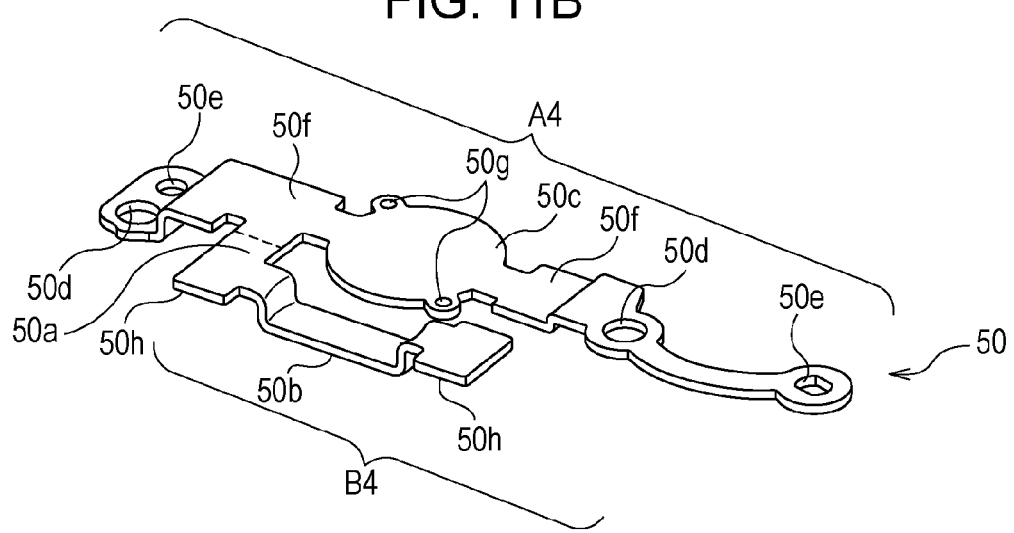
FIG. 11B is a diagram of the strap attaching member in a state after the first portion is subjected to folding.
Figure 11C:
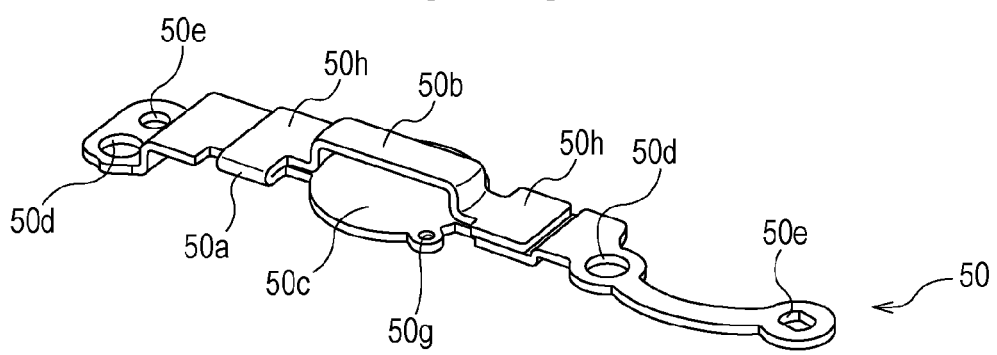
FIG. 11C is a diagram of the strap attaching member in a completed state in which a joint portion in the state in FIG. 11B is subjected to folding.

FIGS. 11A to 11C are diagrams illustrating the strap attaching member 50. FIG. 11A is a diagram of the strap attaching member 50 in a state before a second portion B4 is subjected to folding. FIG. 11B is a diagram of the strap attaching member 50 in a state after the second portion B4 is subjected to folding. FIG. 11C is a diagram of the strap attaching member 50 in a completed state after a joint portion 50a is subjected to folding from the state in FIG. 11B.

As shown in FIGS. 11A and 11B, a first portion A4 of the strap attaching member 50 is provided with a bottom surface 50c, fixing portions 50d, fit portions 50e, and first areas 50f. The first areas 50f are provided at both sides of the bottom surface 50c. The second portion B4 of the strap attaching member 50 is provided with an upper surface 50b and second areas 50h. The second areas 50h are provided at both sides of the upper surface 50b. The second portion B4 of the strap attaching member 50 is provided in parallel with the first portion A4 of the strap attaching member 50.

An orientation in which the bottom surface 50c and the first areas 50f are arranged side by side in the first portion A4 of the strap attaching member 50 and an orientation in which the upper surface 50b and the second areas 50h are arranged side by side in the second portion B4 of the strap attaching member 50 are the same.

As shown in FIGS. 11A and 11B, the joint portion 50a is provided between the first portion A4 and the second portion B4. The joint portions 50a joins one of the first areas 50f provided at both sides of the bottom surface 50c and one of the second areas 50h provided at both sides of the upper surface 50b.

By performing folding on the dotted line portions shown in FIG. 11A, the strap attaching member 50 reaches the state shown in FIG. 11B. Furthermore, by performing folding on the dotted line portion of the joint portion 50a shown in FIG. 11B, the strap attaching member 50 reaches the state shown in FIG. 11C. The state shown in FIG. 11C is the completed state of the strap attaching member 50. When the strap attaching member 50 is in the state shown in FIG. 11C, the back surface of the upper surface 50b and the bottom surface 50c face each other, and the first areas 50f provided at both sides of the bottom surface 50c and the second areas 50h provided at both sides of the upper surface 50b lie on top of one another. By performing welding, such as spot welding, on the positions where the first areas 50f and the second areas 50h lie on top of one another, the first portion A4 acts to prevent deformation of the upper surface 50b even if a large force is exerted on the upper surface 50b. The second portion B4 has a length so as not to overlap with the fixing portions 50d and the fit portions 50e when the strap attaching member 50 is in the state shown in FIG. 11C.

Holes 50g provided outside the bottom surface 50c are holes for coating electrodes when the strap attaching member 50 is subjected to electrodeposition coating. When the strap attaching member 50 is subjected to electrodeposition coating, only the vicinity of the holes 50g is not subjected to electrodeposition coating, so that the vicinity of the holes 50g is not coated. The holes 50g are located outside the circumference of the bottom surface 50c and outside the through hole 41a of the top side cover 41. Since the holes 50g are located outside the through hole 41a, the uncoated areas in the vicinity of the holes 50g are inside the digital camera 100', so that they do not form the external appearance of the digital camera 100'.

In the fifth embodiment, since the portion to which a strap is to be attached (upper surface 50b) and the portion that closes the through hole 41a of the top side cover 41 can be formed of the single strap attaching member 50, a thin, compact strap attaching member can be achieved at a low manufacturing cost.

In the fifth embodiment, the bottom surface 50c completely closes the through hole 41a, and there is no gap between the through hole 41a and the digital camera 100', which prevents unwanted light flux from entering the digital camera 100'.

In the fifth embodiment, the first portion A4 is provided with the fixing portions 50d to be fixed to the fixing member 13, and the second portion B4 is provided with the upper surface 50b exposed to the outside of the digital camera 100'. Thus, even if heat in the digital camera 100' is transmitted to the first portion A4 via the fixing member 13, most of the heat is dissipated at the bottom surface 50c, so that the amount of heat transmitted to the upper surface 50b is small.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-283613 filed Dec. 26, 2011 and No. 2012-232913 filed Oct. 22, 2012, which are hereby incorporated by reference herein in their entirety.

What is claimed is:

1. An electronic apparatus comprising:
a strap attaching member to which a strap can be attached,
wherein the strap attaching member includes: a first portion in which a fixing portion for the electronic apparatus, an upper surface, and first areas located at both sides of the upper surface are provided; a second portion in which a bottom surface and second areas located at both sides of the bottom surface are provided; and a joint portion that joins the first portion and the second portion together, and
wherein the strap attaching member is formed by folding the joint portion so that the back of the upper surface and the bottom surface face each other and the first areas and the second areas lie on top of one another.

2. The electronic apparatus according to claim 1, wherein the upper surface is formed by bending.

3. The electronic apparatus according to claim 1, wherein the upper surface is formed by drawing.

4. The electronic apparatus according to claim 1, wherein the first portion and the second portion are provided in parallel with each other; and
wherein the joint portion joins one of the first areas and one of the second areas together.

5. The electronic apparatus according to claim 1, wherein the first portion and the second portion are provided in series with each other; and
wherein the joint portion is provided outside the fixing portion.

6. The electronic apparatus according to claim 1, wherein the strap attaching member is formed by folding the joint portion, and
thereafter being subjected to welding at positions where the first areas and the second areas lie on top of one another.

7. An electronic apparatus comprising:
a strap attaching member to which a strap can be attached,
wherein the strap attaching member includes: a first portion in which a fixing portion for the electronic apparatus, a bottom surface, and first areas located at both sides of the bottom surface are provided; a second portion in which an upper surface and second areas located at both sides of the upper surface are provided; and a joint portion that joins the first portion and the second portion together, and
wherein the strap attaching member is formed by folding the joint portion so that the back of the upper surface and the bottom surface face each other and the first areas and the second areas lie on top of one another.

8. The electronic apparatus according to claim 7,
wherein the upper surface is formed by bending.

9. The electronic apparatus according to claim 7,
wherein the first portion and the second portion are provided in parallel with each other; and
wherein the joint portion joins one of the first areas and one of the second areas together.

10. The electronic apparatus according to claim 7,
wherein the strap attaching member is formed by folding the joint portion, and
thereafter being subjected to welding at positions where the first areas and the second areas lie on top of one another.

11. The electronic apparatus according to claim 7, further comprising:
an exterior member provided with a through hole from which the upper surface and the bottom surface of the strap attaching member are exposed,
wherein the bottom surface is larger than the through hole to close the through hole.

12. The electronic apparatus according to claim 11,
wherein a hole for electrodeposition coating is provided outside the bottom Surface.

\* \* \* \* \*